United States Patent [19]
Lee

[11] Patent Number: 6,092,190
[45] Date of Patent: Jul. 18, 2000

[54] ELECTRONIC APPARATUS INCLUDING A MEMORY DEVICE AND METHOD OF REPROGRAMMING THE MEMORY DEVICE

[75] Inventor: Daniel John Lee, Brentwood, United Kingdom

[73] Assignee: Neopost Limited, Essex, United Kingdom

[21] Appl. No.: 08/792,425

[22] Filed: Jan. 30, 1997

[30] Foreign Application Priority Data

Jan. 31, 1995 [GB] United Kingdom .................. 9601900

[51] Int. Cl.[7] ........................................ G06F 9/06
[52] U.S. Cl. ........................... 713/2; 713/1; 713/100
[58] Field of Search .................... 395/651, 652, 395/653; 380/51; 348/10, 12, 7; 711/115; 713/1, 2, 100; 712/205

[56] References Cited

U.S. PATENT DOCUMENTS

| | | | |
|---|---|---|---|
| 5,155,837 | 10/1992 | Liu et al. ............................ | 395/500 |
| 5,257,380 | 10/1993 | Lang ................................... | 395/700 |
| 5,327,531 | 7/1994 | Bealkowski et al. . | |
| 5,473,775 | 12/1995 | Sakai et al. ........................ | 395/700 |
| 5,522,076 | 5/1996 | Dewa et al. ........................ | 395/700 |
| 5,579,522 | 11/1996 | Chriteson et al. ................. | 395/652 |
| 5,774,554 | 6/1998 | Gilham ................................ | 380/51 |

FOREIGN PATENT DOCUMENTS

| | | |
|---|---|---|
| 0569178 A2 | of 0000 | European Pat. Off. . |
| 0 512 454 A2 | 11/1992 | European Pat. Off. . |
| 43 32 499 A1 | 3/1995 | Germany . |

OTHER PUBLICATIONS

International Search Report.
European Search Report.

*Primary Examiner*—Glenn A. Auve
*Assistant Examiner*—Tim Vo
*Attorney, Agent, or Firm*—Shoemaker and Mattare, Ltd

[57] ABSTRACT

A method of reprogramming memory storing program instruction code for controlling operation of a microprocessor in which new data can be written to the memory by the microprocessor only in a write cycle and stored data can be read from the memory by the microprocessor only in a read cycle, the memory preventing the read cycle and said write cycle occurring at the same time is disclosed. The memory has first and second sectors for storing code, the first sector storing boot code for controlling operation of the microprocessor. The disclosed method includes the steps of erasing code stored in said second sector, writing new code including the boot code to the second sector, erasing the first sector, writing new boot code in the first sector preceded by an instruction to jump to said second sector and then rendering the jump instruction ineffective so that the next boot of the microprocessor will cause the microprocessor to be controlled by the new boot code in the first sector.

11 Claims, 2 Drawing Sheets

ELECTRONIC APPARATUS INCLUDING A MEMORY DEVICE AND METHOD OF REPROGRAMMING THE MEMORY DEVICE

BACKGROUND OF THE INVENTION

This invention relates to electronic apparatus including one or more memory devices for storing data and in particular to electronic apparatus including one or more so-called "Flash" memory devices.

Flash memory devices are well known in the data processing art and comprise circuits including semi-conductors designed to store electrical signals in a non-volatile manner. That is to say such memory devices continue to store signals representing data even when electrical power to the circuit is terminated. Unlike some other semi-conductor storage devices used for non-volatile storage of data, flash memory devices have the capability of being reprogrammed, i.e. the data stored in flash memory devices can be erased and new data written into the memory, without removal of the device from the electronic apparatus. Semi-conductor devices which require to be removed to enable reprogramming of the device need to be removably mounted in a device socket and this leads to increased cost of manufacture of the apparatus as well as a potential loss in reliability due to possible resistance in the interface between pins of the device and pin receiving sockets of the device socket. For reliability and reduction in cost of manufacture it is desirable for the memory device to be permanently soldered, for example by surface mounting, to electrical connections of a printed circuit board.

Flash memory devices may be programmed prior to being soldered to the printed circuit board. When a flash memory device is utilised for storing program instruction code including boot software instruction code, a microprocessor of the apparatus operating under the control of the program instruction code needs to read at least the boot code from the memory in order to perform functions including reprogramming of the memory. Accordingly in order to reprogram the memory it is necessary for the microprocessor to be able to read instruction code from the memory as well as to write new instruction code into the memory. However flash memory devices do not permit programming or reprogramming of the memory at the same time as reading data or code from the memory. Therefore it is necessary for the program instruction code, including the boot code, to be stored in another memory device from which the microprocessor can read the program instruction code so as to operate under the code stored in the other memory device to perform the operations required for reprogramming the flash memory. Therefore, in known electronic apparatus or systems incorporating flash memory where the flash memory is intended not to be removed from the apparatus for reprogramming, if it is desired to reprogram the flash memory the apparatus is provided with a separate memory device to hold 'boot' software instruction code. Usually in microprocessor operated electronic apparatus, random access memory is provided for the temporary storage of data during operation of the microprocessor. Accordingly the random access memory may be used to store the program instruction code and the microprocessor is operated under control of the instruction code stored in the random access memory while the reprogramming of the flash memory is effected. Initially the microprocessor, operating under the program instruction code stored in the flash memory, reads the code from the flash memory and writes the code to the random access memory. Thus a copy of the program instruction code is stored in the random access memory. A signal then switches operation of the microprocessor from being under control of code stored in the flash memory to being under control of the code stored in the random access memory. This switching signal is a hardware signal.

It will be appreciated that the random access memory is volatile and any data or code stored therein is lost when power to the memory is terminated. While the entire program instruction code is still stored in the non-volatile flash memory, the system remains in an operational condition and when power is restored the microprocessor will be operable once again under control of the program instruction code stored in flash memory. However if the power supply fails and the supply of power to the random access is terminated, the program instruction code previously stored in the random access memory is lost and in addition the original program instruction code in the flash memory will have been wholly or partially erased and only a part of the new instruction code written to the flash memory. Accordingly as a result of loss of power and consequent shut down of the system there is no longer stored in the system a complete original program instruction code or complete new program instruction code. Without a complete program instruction code, the microprocessor is incapable of operating and the system remains inoperative until such time as the flash memory device is replaced or is reprogrammed by a different less convenient method.

SUMMARY OF THE INVENTION

According to one aspect of the invention in a method of reprogramming memory storing program instruction code for controlling operation of a microprocessor in which new data can be written to the memory by the microprocessor only in a write cycle and stored data can be read from the memory by the microprocessor only in a read cycle, said memory preventing the read cycle and said write cycle occurring at the same time wherein the memory has at least first and second sectors for storing code, said first sector storing boot code for controlling operation of the microprocessor, the method includes the steps of erasing code stored in said second sector; writing new code to said second sector, said new code including said boot code; erasing the first sector, said first sector when erased being in a state such that the microprocessor in executing the boot code runs through to the boot code stored in the second sector; writing new boot code in said first sector preceded by an instruction to jump to said second sector; and then rendering the jump instruction ineffective whereby the next boot of the microprocessor will cause the microprocessor to be controlled by said new boot code in said first sector.

According to another aspect of the invention electronic apparatus includes memory reprogrammable by the method defined hereinbefore. The electronic apparatus may be postage metering apparatus.

BRIEF DESCRIPTION OF THE DRAWING

An embodiment of the invention will now be described by way of example with reference to the drawings in which.

DESCRIPTION OF THE PREFERRED EMBODIMENT

Figure 1:
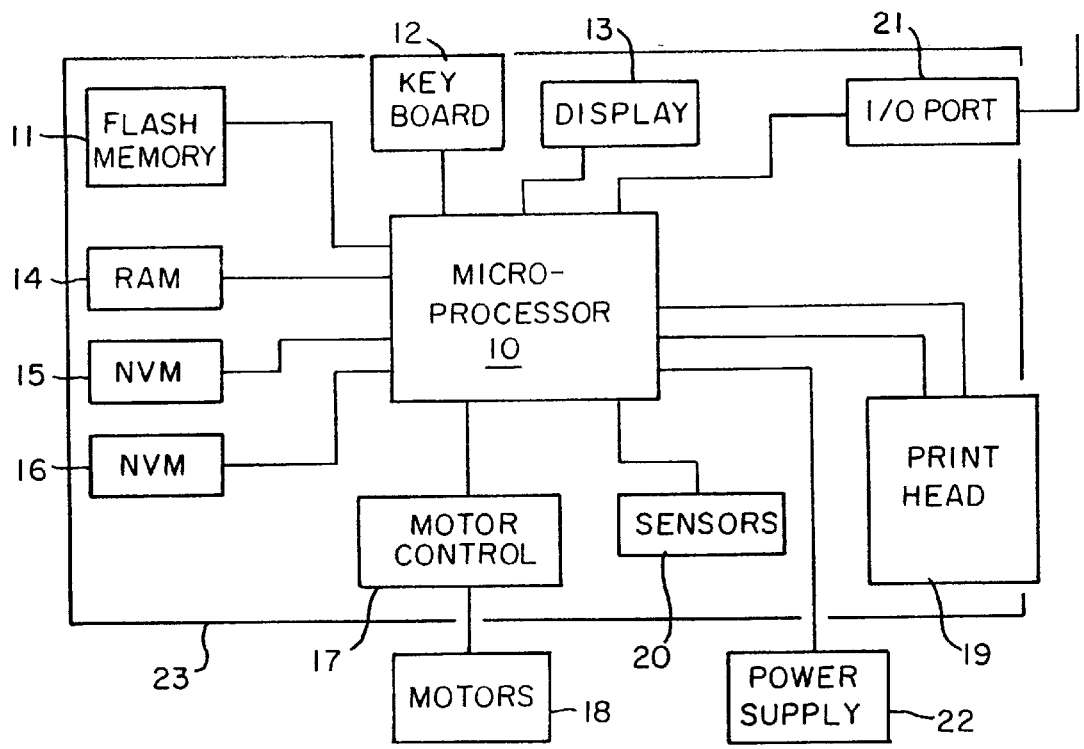
FIG. 1 is a block diagram of electronic apparatus comprising a postage meter.

Referring first to FIG. 1, the postage meter includes electronic accounting and control means comprising a micro-processor 10 operating under program routines stored in a flash memory 11. A keyboard 12 is provided for input of commands and data by a user and a display 13 is provided to enable display of information to the user. A random access memory (RAM) 14 is provided for use as a working store for storage of temporary data during operation of the postage meter. Non-volatile duplicated memories 15, 16 are provided for the storage of critical data relating to use of the postage meter and which is required to be retained even when the postage meter is not powered. The microprocessor 10 carries out accounting functions in relation to use of the postage meter for franking mail items with postage charges applicable to handling of the mail items by the postal authority or another carrier. Accounting data relating to use of the postage meter for printing franking impressions representing postage charges for mail items and any other critical data to be retained is stored in the non-volatile memories 15, 16. The accounting data includes a value of credit available for use by the meter in franking mail items, an accumulated total of value used by the meter in franking mail items, a count of the number of mail items franked by the meter and a count of the number of mail items franked with a postage charge in excess of a predetermined value. The value of credit is stored in a descending credit register, the accumulated total value is stored in an ascending tote register, the count of items is stored in an items register and the count of items franked with a postage charge in excess of a predetermined value is stored in a large items register. As is well known in the postage meter art, each of the registers referred to hereinbefore for storing accounting data is replicated in order to enable integrity of the accounting data to be maintained even in the event of a fault or termination of power to the meter during a franking operation. Two replications of each of the registers are provided in each of the memory devices 15, 16.

A motor controller 17 is controlled by the microprocessor to control operation of motors 18 driving feeding means (not shown) for feeding a mail item past a digital print head 19. Sensors 20 are provided to sense and monitor feeding of the mail item. An input/output port 21 is provided to enable communication between the postage meter and external apparatus. A power supply 22 receiving power from a mains supply of electricity provides power at the required voltages to components of the postage meter.

It will be appreciated that, as is well known in the postage meter art, the postage meter must operate in a secure manner and be protected from attempts to use the meter fraudulently for example by utilising the postage meter to print franking impressions on mail items for which no corresponding postage charge has been accounted for by the accounting means. Accordingly those parts of the postage meter required to be secured against unauthorised tampering are housed in a secure housing 23.

Figures 2, 4:
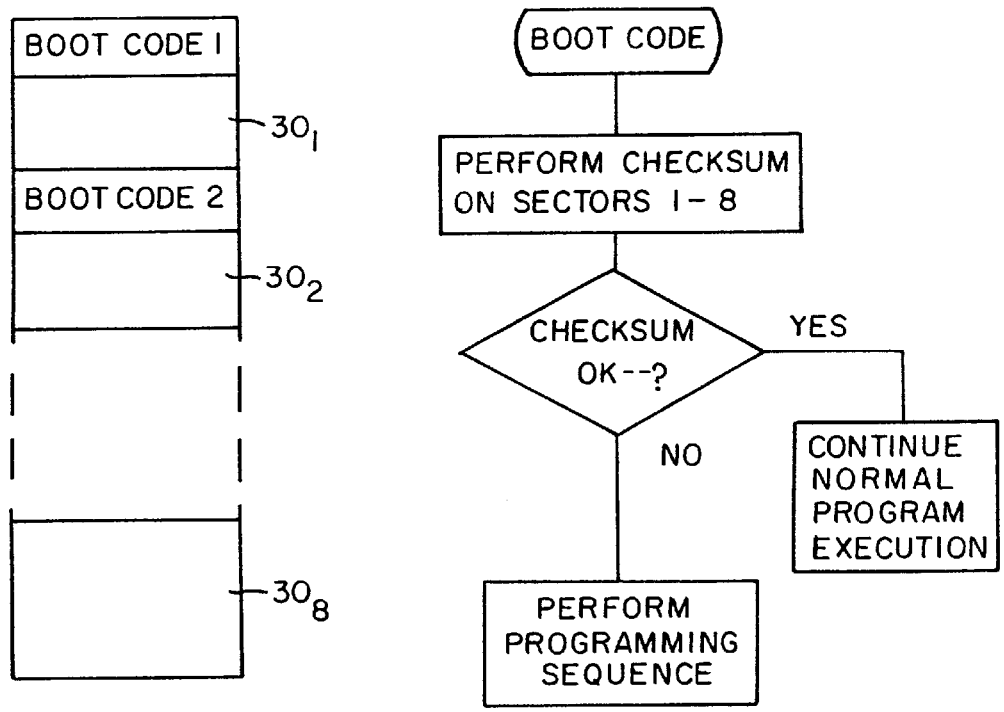
FIG. 2 illustrates a flash memory having a plurality of sectors.
FIG. 4 is a flow chart of a checking sub-routine.
Figure 3:
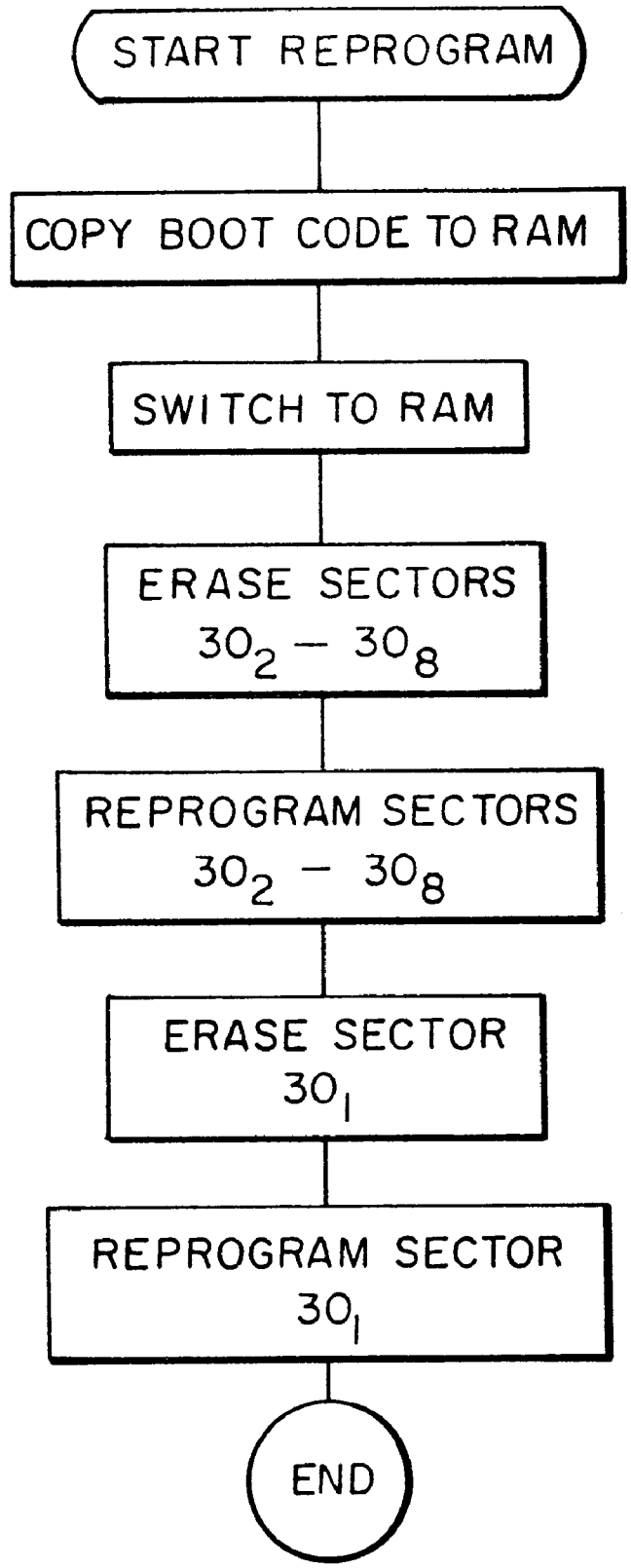
FIG. 3 is a flow chart illustrating steps in reprogramming the flash memory.

Referring now to FIG. 2 and 3, FIG. 2 illustrates the sectored architecture of the flash memory device 11. In the illustration of FIG. 2 the memory is shown by way of example as having eight sectors 30 numbered $30_1$ to $30_8$, however it is to be understood that the flash memory device may have a different number of sectors. When reprogramming the flash memory 11 only whole sectors 30 can be erased at any time. Initially the program instruction boot code is stored in sector $30_1$ and the microprocessor is arranged to access this sector $30_1$ whenever the microprocessor is reset. Program instruction code, other than boot code is stored in one or more of the remaining sectors $30_2$ to $30_8$.

When a reprogramming operation to write new code into the flash memory is to be performed, the boot code stored in sector $30_1$ is copied to RAM 14 and operation of the microprocessor is switched to be controlled by the boot code now stored in RAM 14. Then the code stored in all of the sectors $30_2$ to $30_8$ is erased while leaving sector $30_1$ containing the boot code unerased. Reprogramming of sectors $30_2$8 with new program instruction code is then commenced. The new programming instruction code includes, for storing at the top of sector $30_2$, a copy of the boot code already stored in sector $30_1$. If reprogramming is interrupted prior to completion of reprogramming of sectors $30_2$ to $30_8$ the code in these sectors will be incomplete or garbled. When the system is reset and the microprocessor is rebooted, the microprocessor is able to operate under the control of the boot code in sector $30_1$ which up until now has not been erased or rewritten. As part of the routine performed under the control of the boot code, the microprocessor performs a sub-routine to check on the code in the flash memory as illustrated by FIG. 4. A checksum is performed in respect of the stored code and if the checksum of the code is OK, the microprocessor continues with normal program execution. However if the checksum is not OK, indicating incomplete or garbled code stored in sectors $30_2$ $30_8$ of the flash memory, the microprocessor re-enters the reprogramming routine and proceeds to perform the reprogramming sequence.

When reprogramming of sectors $30_2$ to $30_8$ has been completed successfully, as determined by the checksum subroutine of FIG. 4, reprogramming of sector $30_1$ is commenced. Sector $30_1$ is erased. If reprogramming of sector $30_1$ is interrupted at this stage the whole of sector $30_1$ contains microcode FF (hex), this being the microcode resulting from erasure of the storage locations in the sector. Therefore, upon reboot of the system after an interruption, the microprocessor will execute the sector $30_1$ containing FF (hex) and harmlessly continue until the program routine runs into the start of sector $30_2$ which contains the boot code. Execution of the boot code will include carrying out the checksum sub-routine and detection of a bad code checksum in respect of sector $30_1$ will be detected. A further attempt to reprogram sector $30_1$ will be made.

Initially, in reprogramming sector $30_1$, the first bytes, for example three bytes, are left in the erased state of FF (hex). The next bytes, for example three bytes, are programmed with a jump instruction 'JMP BOOT2' to cause the program to jump to the boot code of sector $30_2$. The remainder of the sector $30_1$ is reprogrammed with the boot code followed by any other code or data to be located in sector $30_1$. Finally when the code now programmed into sector $30_1$ has been verified by the checksum sub-routine of FIG. 4, the first bytes of sector $30_1$ are programmed from FF (hex) to 'JMP BOOT1'. Hence upon rebooting of the system, execution of the program will first encounter the jump instruction 'JMP BOOT1' and the program will jump to the boot code located in sector $30_1$ immediately after the jump instruction 'JMP BOOT2' thereby by-passing this latter instruction. Thus it will be appreciated that apart from the relatively short time period of the order of a few milliseconds when the instruction 'JMP BOOT2' is programmed into the flash memory and later during the equally short time period when the instruction 'JMP BOOT1' is programmed into the memory, the flash memory contains fully executable boot code and the system can recover from any interruption of reprogramming the flash memory.

While the system described hereinbefore relates to reprogramming of flash memory it is to be understood that it is also applicable to other forms of non-volatile memory in which the memory does not permit writing of new data into the memory at the same time as reading data from the memory.

I claim:

1. A method of reprogramming memory storing program instruction code for controlling operation of a microprocessor in which new data can be written to the memory by the microprocessor only in a write cycle and stored data can be read from the memory only in a read cycle, said memory preventing the read cycle and said write cycle occurring at the same time wherein the memory includes at least first and second sectors for storing program instruction code, said first sector storing boot code for controlling operation of the microprocessor in a boot routine, the method including the steps of erasing program instruction code stored in said second sector; writing new program instruction code to said second sector, said new program instruction code including said boot code; erasing the first sector, said first sector when erased being in a state such that accessing of the first sector by the microprocessor in executing the boot routine causes execution of the boot routine to run through to the boot code stored in the second sector; writing in said first sector new boot code and an instruction to jump to said second sector; said jump instruction being executed in precedence to said new boot code; and then rendering the jump instruction ineffective whereby the next boot routine of the microprocessor causes the microprocessor to be controlled by said new boot code stored in said first sector.

2. A method as claimed in claim 1 wherein after writing the new program instruction code to the second sector and prior to erasing the first sector, the microprocessor carries out a step of determining if the new program instruction code has been successfully written in the second sector and in response to a determination that the new program instruction code has been successfully written in the second sector carries out the step of erasing the first sector.

3. A method as claimed in claim 1 wherein after writing new boot code to the first sector, the microprocessor carries out a check to determine if the new boot code has been successfully written in the first sector.

4. A method as claimed in claim 1 wherein the memory is non-volatile.

5. A method as claimed in claim 1 wherein prior to commencement of the reprogramming of the memory, the boot code stored in the first sector is copied to a volatile memory device.

6. Postage metering apparatus including memory reprogrammable by the method as claimed in claim 1.

7. A method as claimed in any claim 4 wherein the memory is a flash memory device.

8. A method of reprogramming memory storing program instruction code for controlling operation of a microprocessor in which new data can be written to the memory by the microprocessor only in a write cycle and stored data can be read from the memory by the microprocessor only in a read cycle, said memory preventing the read cycle and said write cycle occurring at the same time and wherein said memory includes a first sector and a second sector; said first sector comprising a plurality of storage locations storing first program instruction code including first boot code and said second sector storing second program instruction code including second boot code; said microprocessor in a boot routine accessing the first sector to cause the microprocessor to be operated under control of said first boot code;

the method including the steps of:
erasing each said storage location of said first sector, then writing to first locations of said storage locations of said first sector third program instruction code including third boot code;
writing to a second location of said storage locations of the first sector a first jump instruction to jump to said second sector, said storage locations being accessed sequentially and said second location storing the first jump instruction being accessed in the sequential access earlier than accessing of said first storage locations storing the third boot code; and
then rendering said first jump instruction ineffective whereby in a next succeeding boot routine the microprocessor accesses and executes the third boot code stored in said first storage locations of said first sector.

9. A method as claimed in claim 8 wherein the first jump instruction is rendered ineffective by writing in a third location of the storage locations of the first sector a second jump instruction to jump to a start of the third boot code stored in the first locations of the storage locations of the first sector, said third storage location being accessed in the sequential access earlier than accessing of the second location of the storage locations of the first sector.

10. A method of reprogramming memory storing program instruction code for controlling operation of a microprocessor in which new data can be written to the memory by the microprocessor only in a write cycle and stored data can be read from the memory by the microprocessor only in a read cycle, said memory preventing the read cycle and said write cycle occurring at the same time and wherein said memory includes a first sector and a second sector; said first sector comprising a plurality of storage locations storing first program instruction code including first boot code and said second sector storing second program instruction code including second boot code; said microprocessor in a boot routine accessing the first sector to cause the microprocessor to be operated under control of said first boot code;

the method including the steps of:
erasing each said storage location of said first sector, then writing to first locations of said storage locations of said first sector third program instruction code including third boot code;
writing to a second location of said storage locations of the first sector a first jump instruction to jump to said second sector, said storage locations being accessed sequentially and said second location storing the first jump instruction being accessed in the sequential access earlier than accessing of said first storage locations storing the third boot code to cause the microprocessor in a boot routine, prior to determination that writing of said third program code is successful, to jump from the first sector to the second sector and thereby to be operated under control of the second boot code;
determining if writing of the third program instruction code is successful and, if successful rendering said first jump instruction ineffective whereby in a next succeeding boot routine the microprocessor accesses and executes the third boot code stored in said first storage locations of said first sector.

11. Electronic apparatus including a memory storing program instruction code and a microprocessor operable under control of said program instruction code, said memory being accessible by the microprocessor in a write cycle to write code to the memory and in a read cycle to read code from the memory; said memory preventing said read cycle and said write cycle occurring at the same time; said memory including a first sector and a second sector; said first sector comprising a plurality or storage locations storing first program instruction code including first boot code and said second sector storing second program instruction code including second boot code; the microprocessor being operative in a boot routine to access the first sector and wherein the microprocessor is operable in a reprogramming routine to:

erase each said storage location of said first sector, then to write to first locations of said storage locations of said first sector third program instruction code including third boot code and to write to a second location of said storage locations of the first sector a first jump instruction to jump to said second sector, said storage locations being accessed sequentially by the microprocessor and said second location storing the first jump instruction being accessed in the sequential access earlier than accessing of said first storage locations storing the third boot code; and then to render said first jump instruction ineffective whereby in a next succeeding boot routine the microprocessor accesses and executes the third boot code stored in said first storage locations of said first sector.

\* \* \* \* \*